United States Patent
O'Brien

(10) Patent No.: US 9,632,308 B2
(45) Date of Patent: Apr. 25, 2017

(54) METHOD OF FABRICATING A MEMS DEVICE

(71) Applicant: Texas Instruments Incorporated, Dallas, TX (US)

(72) Inventor: Sean Christopher O'Brien, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 4 days.

(21) Appl. No.: 14/685,099

(22) Filed: Apr. 13, 2015

(65) Prior Publication Data
US 2016/0299334 A1 Oct. 13, 2016

(51) Int. Cl.
*G03F 7/26* (2006.01)
*G02B 26/08* (2006.01)

(52) U.S. Cl.
CPC .......... *G02B 26/0833* (2013.01); *G03F 7/26* (2013.01)

(58) Field of Classification Search
None
See application file for complete search history.

(56) References Cited

U.S. PATENT DOCUMENTS

| | | | | |
|---|---|---|---|---|
| 2007/0242343 A1* | 10/2007 | Roth | ............... | G02B 5/0858 359/291 |
| 2009/0231673 A1* | 9/2009 | Oden | ............ | G02B 26/0841 359/291 |
| 2010/0240215 A1* | 9/2010 | Huang | ............. | B81C 1/0015 438/669 |

* cited by examiner

*Primary Examiner* — Kathleen Duda
(74) *Attorney, Agent, or Firm* — Michael A. Davis, Jr.; Charles A. Brill; Frank D. Cimino

(57) ABSTRACT

A microelectromechanical system (MEMS) is comprised of a micromirror device attached to a semiconductor device. A first spacer layer is formed and patterned to form hinge via openings. A hinge metal is deposited above the first spacer layer to form the hinge and the hinge vias. A capping layer is formed above the hinge metal and hinge vias. A second spacer layer is formed above the capping layer and patterned to form a mirror via. The capping layer protects the hinge metal from the developer solution used in the patterning step. The capping layer is removed from within the mirror via opening. Another metal layer is deposited above the second spacer layer to form the mirror and the mirror via.

13 Claims, 6 Drawing Sheets

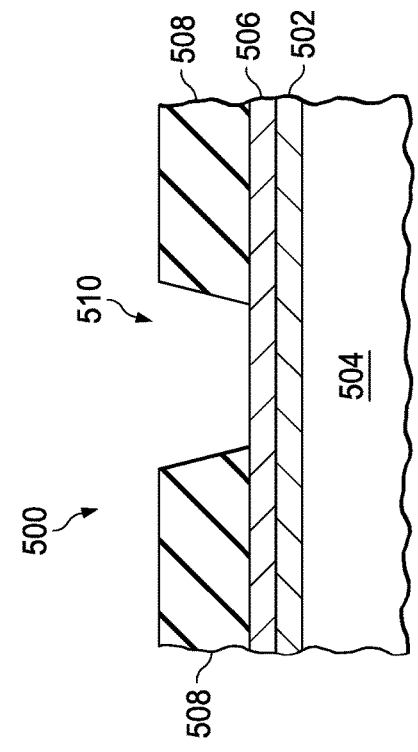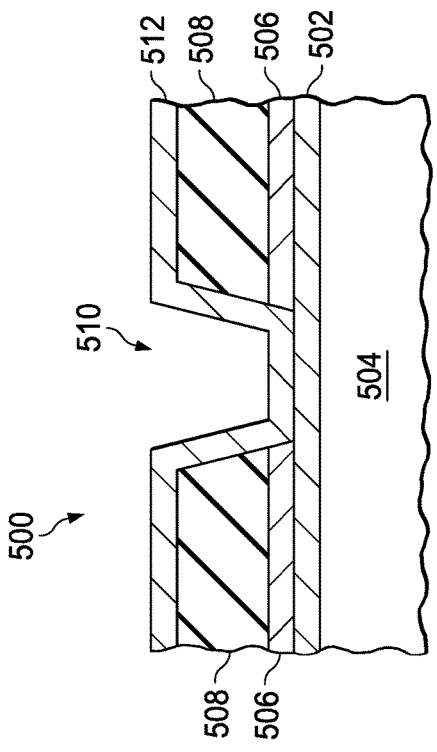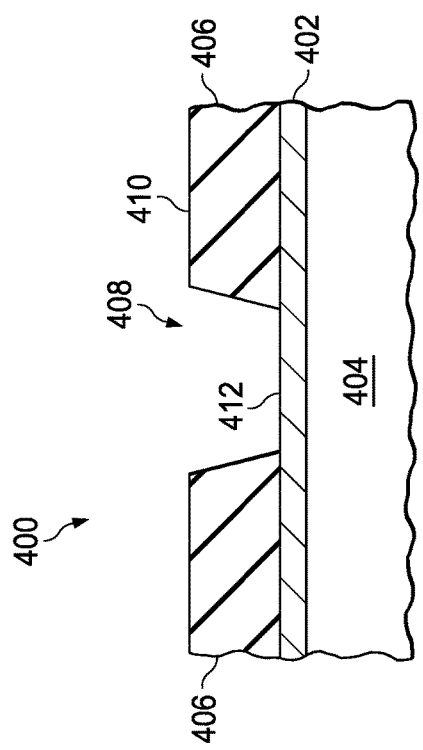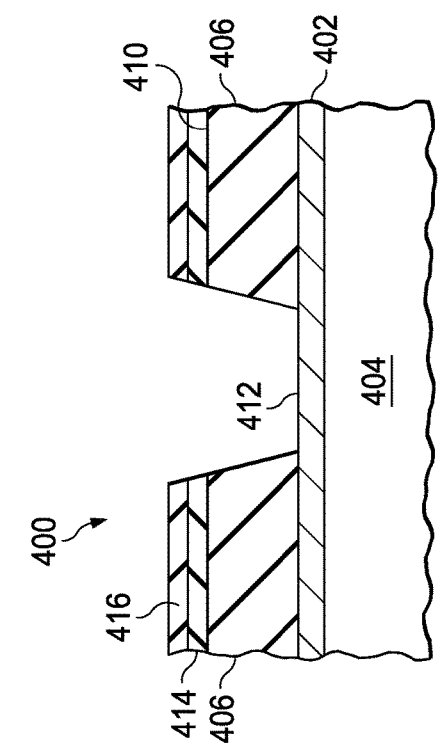

METHOD OF FABRICATING A MEMS DEVICE

This relates generally to the fabrication of microelectromechnical systems (MEMS) and, in particular, to fabrication of the digital micromirror device (DMD).

BACKGROUND

Microelectromechanical systems (MEMS) devices like Texas Instruments DLP® digital micromirror devices (DMDs) use an array of individually positionable mirrors to form images for projection onto a display surface. Micromechanical components of the mirror array are fabricated over a substrate containing CMOS circuitry for addressing and controlling the positioning of the mirrors. Information regarding the fabrication of such devices is given in L. J. Hornbeck, "Digital Light Processing for High-Brightness, High Resolution Applications", Proc. SPIE vol. 3013, pp. 27-40, Projection Displays III, February 1997 and C. Gong & T. Hogan, "CMOS Compatible Fabrication Processes for the Digital Micromirror Device", IEEE J. Electron Devices, vol. 2, no. 3, pp. 27-32, May 2014, the entireties of both of which are incorporated herein by reference.

FIG. 1 (Prior Art) shows a cross-sectional image of DMD MEMS device 100 fabricated according to a process such as that described by Gong et. al. FIG. 1 illustrates the interconnections of mirror and hinge layers through hinge and mirror support vias to the underlying CMOS structure. Device 100 comprises a micromechanical component portion 102 above a CMOS portion 104. Substrate 106 comprises SRAM cell transistors 108 and other circuit elements for data loading and voltage application for mirror positioning.

A first dielectric layer 110 is formed above transistors 108. A first metal (M1) layer 112 is formed and patterned above the first dielectric layer 110. A second dielectric layer 114 is formed and patterned above the M1 layer 112. A second metal (M2) layer 116 is formed and patterned above the second dielectric layer 114. A third dielectric layer 118 is deposited and patterned above the M2 layer 116. A third metal (M3) layer 120 is formed and patterned above the third dielectric layer 118.

A spacer layer 122, typically a photoresist material, is deposited above the third metal layer 120. The spacer layer 122 is sacrificial and removed in a later step. Hinge vias 124 are patterned within the spacer layer 122. A hinge metal is deposited above the spacer layer 122 to form the hinge 126 and within the hinge vias 124 to form the walls of the hinge vias 128. Another spacer layer 130, typically a photoresist material, is deposited above the hinge 126. The spacer layer 130 is sacrificial and will be removed in a later process. A mirror via 132 is patterned within the spacer layer 130 and a mirror metal is deposited above the spacer layer 130 and within the mirror via 132 to form a mirror 134. The mirror via 132 may remain partially unfilled after mirror metal 134 deposition and a central indentation 136 may remain within the reflective mirror surface above the mirror via 132. After processing is completed a plasma ash undercut process removes the sacrificial spacer layers.

A developer solution such as tetramethyl ammonium hydroxide is used in the photolithography patterning steps to remove the exposed photoresist. This developer solution is required for pattern formation.

FIG. 2 (Prior Art) shows a top-down image of a device 200 comprising mirrors 202.

The develop process results in a residue 204 formed within spaces 206 separating individual mirrors 202. The residue 204 is an organo-metallic and can interfere with undercut processes. It may also cause discoloration across the device and the hinge torque, and result in image quality defects for the DMD.

It is possible that formation of the residue 204 occurs when titanium atoms are dislodged from the exposed hinge metal 126 during the develop process and are transported from the bottom of the mirror via to the top of the spacer layer 130. Titanium atoms interact with the spacer layer 130 and mirror metal, an aluminum alloy, to form the residue 204. The residue 204 acts as a block against reactants during etching processes and sacrificial spacer layers may be non-uniformly removed.

The photolithography used in this process is 365 nm (i-line). i-line photolithography is typical in semiconductor manufacturing and has been extensively studied and tested. Experiments have shown that varying other typical photoresists used for this process does not address formation of the residue 204.

FIG. 3 (Prior Art) shows a top-down image of an array 300 of mirrors 302. An organo-metallic residue 304 can be seen over multiple areas of the array 300. The residue 304 is visible as a light discoloration in spaces between individual mirrors 302. The residue 304 is of greater significance as dimensions of the mirror 302 decrease and residue 304 is deposited across a larger number of mirrors 302 within the same surface area. The residue 304 prevents optimal undercut of the mirrors 302 for removing spacer layers and for releasing hinges and mirrors 302. The residue 304 occurs randomly across a substrate. Device performance, contrast, and reliability can be negatively affected.

FIGS. 4A and 4B (Prior Art) describe the formation of a residue above a portion 400 of the mirror 302.

In FIG. 4A, a hinge metal 402 is formed above a spacer layer 404, typically a photoresist. A spacer layer 406, typically a photoresist, is formed above the hinge metal 402 and patterned to form a mirror via 408. After patterning of the via 408, the top surface 412 of the hinge metal 402 is exposed. During the develop process, titanium atoms migrate from the top surface 412 to the top surface 410 of the spacer layer 406.

FIG. 4B shows the portion 400 once a residue has formed. The residue forms a layer 414 on the top surface 410 of the layer 406. A mirror metal 416 is formed above the spacer layer 406 and the layer 414. The layer 414 prevents removal of the spacer layer 406 for releasing the mirror.

SUMMARY

A method of fabricating a MEMS device addresses organo-metallic residue. A first spacer layer is formed above a substrate. The first spacer layer is patterned to form hinge via openings. A layer of hinge metal is deposited above the first spacer layer to form a hinge and hinge vias. A capping layer, such as carbon or silicon oxynitride, is formed above the hinge metal layer. A second spacer layer is formed above the capping layer and patterned with developer to form a mirror via opening. The capping layer forms a barrier between the developer solution and the hinge metal within the mirror via. The capping layer within the mirror via is removed prior to deposition of a mirror metal.

BRIEF DESCRIPTION OF THE DRAWINGS

Example embodiments are described with reference to accompanying drawings, wherein:

FIGS. 4A and 4B (Prior Art) illustrate the formation of a residue above a portion of the mirror.

FIGS. 5A and 5B illustrate a portion of a mirror with a capping layer.

DETAILED DESCRIPTION OF EXAMPLE EMBODIMENTS

Figure 1:
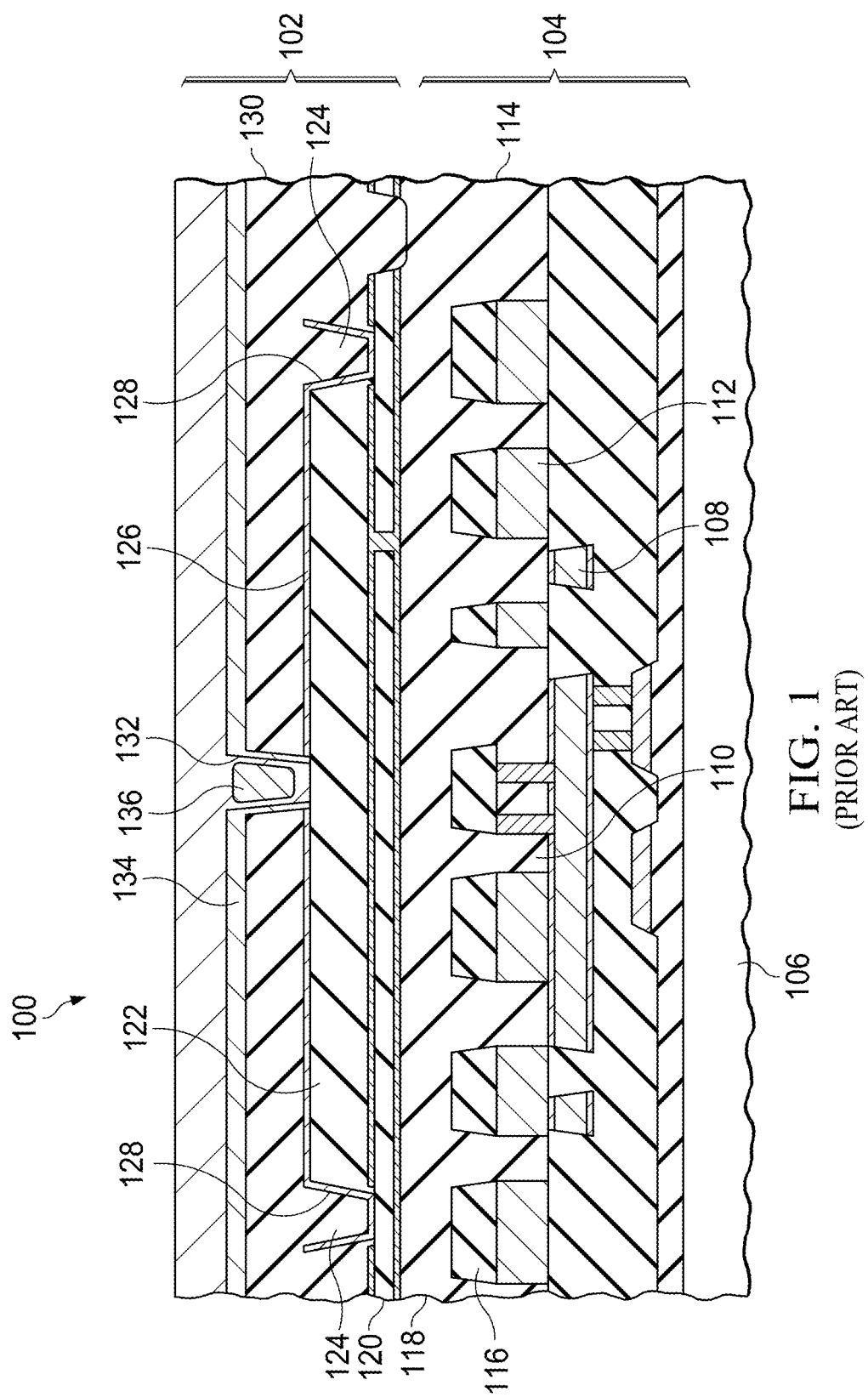
FIG. 1 (Prior Art) is a cross-sectional view of a micromirror device.
Figure 2:
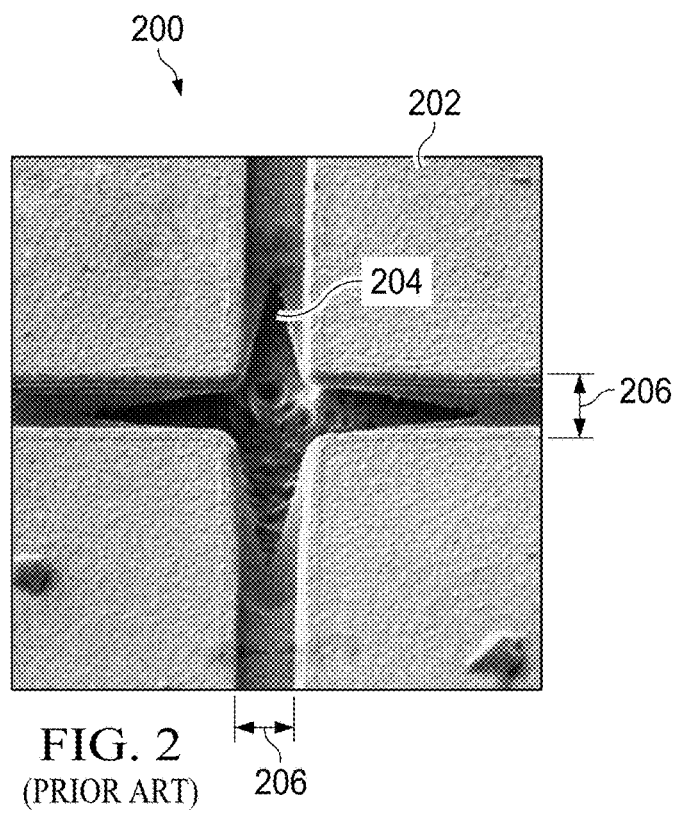
FIG. 2 (Prior Art) is a scanning electron microscope image of organo-metallic residue across an intersection of mirrors.
Figure 3:
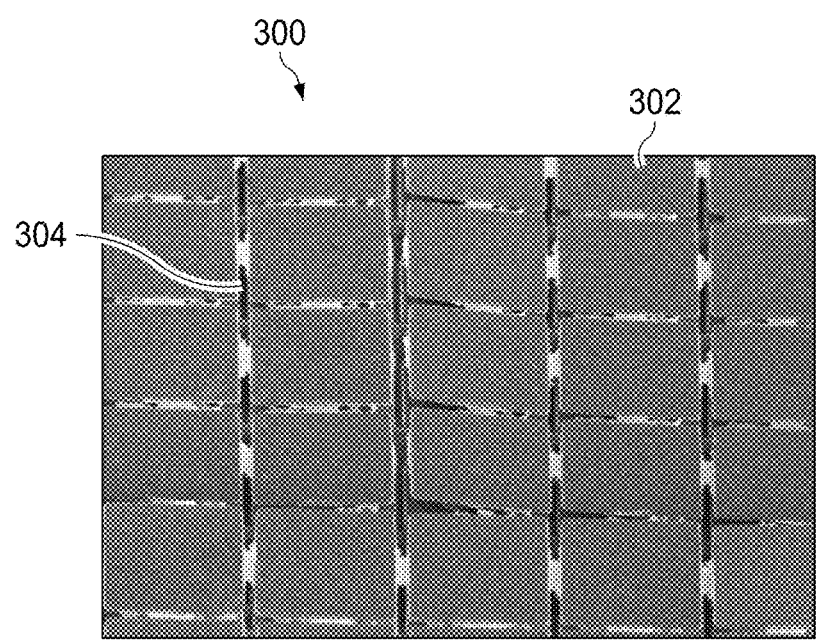
FIG. 3 (Prior Art) is a scanning electron microscope image of a mirror array with organo-metallic residue.

The steps described below are typically undertaken on a wafer level scale, with multiple instances of the illustrated structures simultaneously formed to define arrays of such structures formed at respective die areas of corresponding simultaneously formed DMD's.

FIGS. 5A and 5B illustrate a portion 500 of a micromirror device with a capping layer 506.

A hinge metal 502 is formed above a spacer layer 504, typically a photoresist. A capping layer 506 is formed above the metal 502. The capping layer 506 is of approximate thickness 100-500 Angstroms. A spacer layer 508, typically a photoresist, is formed above the capping layer 506 and is patterned to form a mirror via 510. The hinge metal 502 is protected by the capping layer 506 from a developer solution used in the patterning process. The capping layer 506 shields the hinge metal 502 from reacting with the developer solution and forming a residue. Referring to FIG. 5B, the capping layer 506 from within the mirror via 510 is removed using a plasma etch process. A mirror metal 512 is formed above the spacer layer 508 and within the mirror via 510.

This process is particularly helpful when the photolithography wavelength used is 365 nm (i-line). Evaluation of multiple i-line photoresists has resulted in formation of a similar organo-metallic residue. Accordingly, the process may alternatively be applied to photolithographic processes at other wavelengths susceptible to organo-metallic residue.

Figure 6:
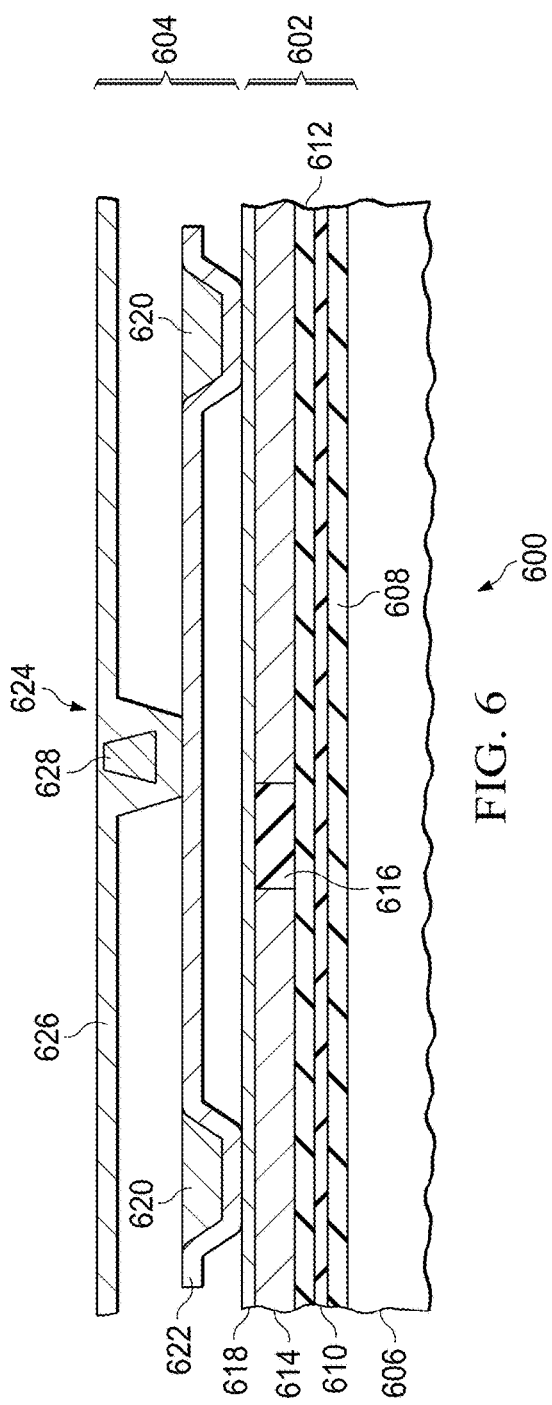
FIG. 6 is a cross-sectional drawing of a micromirror device.

FIG. 6 illustrates a micromirror device 600, comprised of a CMOS portion 602 and a MEMS portion 604.

The CMOS portion 602 comprises a substrate 606 with transistors and metal interconnect layers. A first metal is deposited above the substrate 606 and patterned to form a first interconnect 608. A first dielectric layer 610 is formed above the layer 608. A second metal is deposited above the dielectric layer 610 and patterned to form a second interconnect 612. A second dielectric 614 is formed above the layer 612 and patterned to form a plug 616. The plug 616 is filled with a metal such as tungsten. A third metal is formed above the dielectric layer 614 and patterned to form a third interconnect 618.

Hinge vias 620 are formed of a metal such as titanium above the CMOS portion 602 and support a hinge 622. Two hinge vias, one at each end of the CMOS portion 602 are shown in FIG. 6. The hinge vias 620 are vertical structures which support the planar and horizontal hinge 622. A centrally placed mirror via 624 is formed above the hinge 622. A metal layer is deposited above the mirror via 624 and forms the mirror 626.

The mirror 626 is reflective and typically formed of an alloy comprising 99% aluminum and 1% titanium. A central indentation 628 may remain within the top surface of the mirror 626.

FIGS. 7A-D illustrate steps for device fabrication.

Figure 7A:
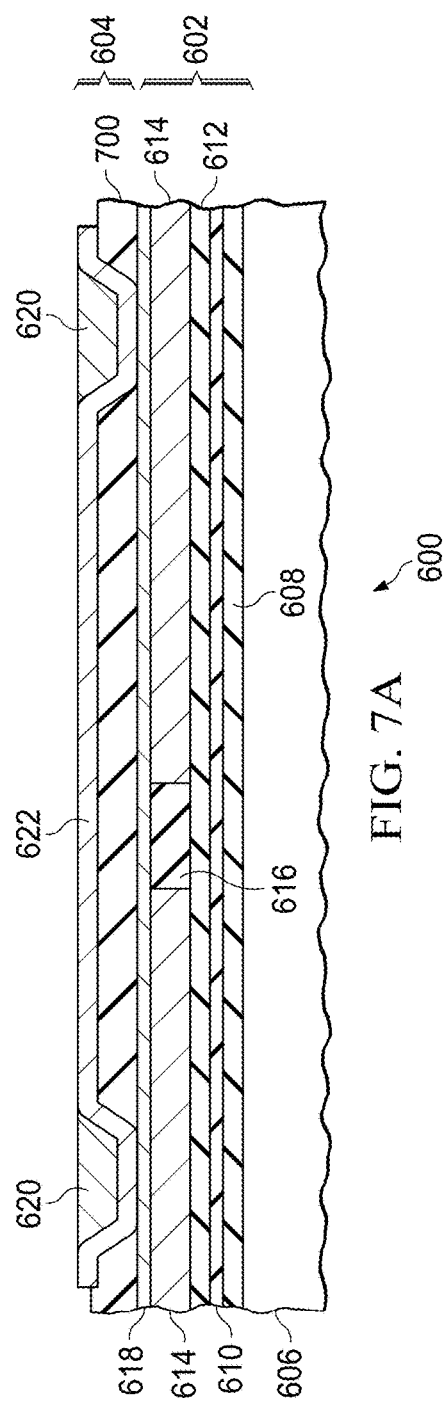
FIGS. 7A-7D illustrate a sequence of a micromirror device in fabrication.

FIG. 7A illustrates the formation of the MEMS portion 604 above CMOS portion 602.

The CMOS portion 602 comprises multiple metal layers and oxide layers. Metal is formed and patterned above the substrate 606 to generate the first interconnect layer 608. Oxide is formed above the first interconnect layer 608 for the insulation layer 610. Metal is formed and patterned above the insulation layer 610 to form the second interconnect layer 612. Oxide is again formed above interconnects 612 for the insulation layer 614. The layer 614 is patterned to form the central plug 616 within the layer 614. Metal is formed and patterned above insulation layer 614 to form the third interconnect layer 618. A sacrificial layer 700 is formed above the third interconnect layer 618 and patterned to form two hinge vias 620 as part of the MEMS 604 portion of the micromirror device 600. A metal such as titanium is formed above the vias 620 and sacrificial layer 700 to generate the hinge 622. The hinge vias 620 may be filled with additional metal for mechanical strength for the via 620 walls.

Figure 7B:
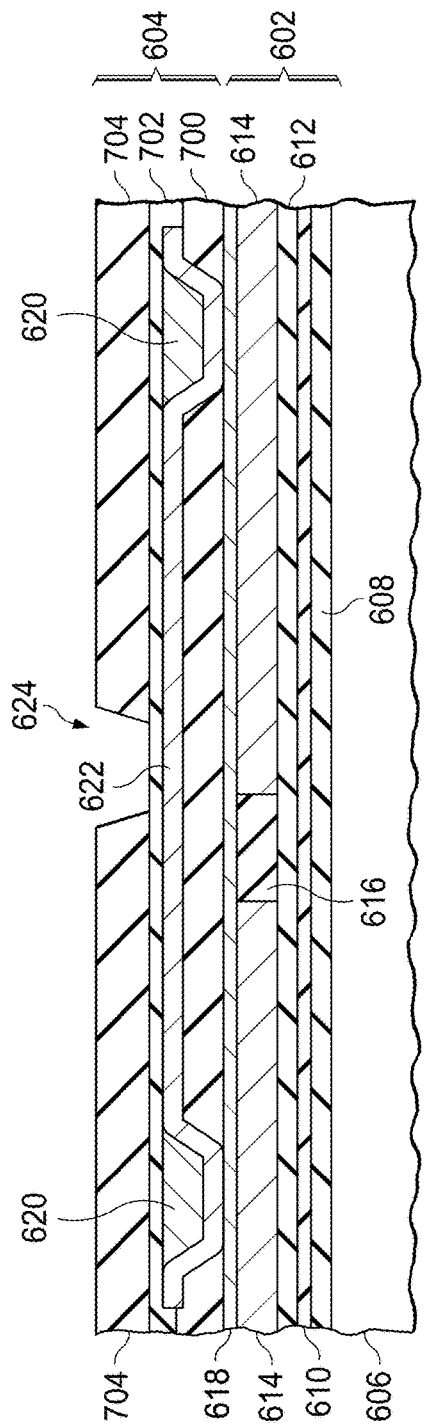

FIG. 7B shows a blanket capping layer 702 formed above the hinge 622 and hinge vias 620. A sacrificial layer 704 is formed above the capping layer 702 and is patterned to form a mirror via 624. Forming via 624 exposes the surface of the capping layer 702 to the developer solution which is used to pattern the device 600. The layer 702 blocks the hinge 622 from the developer solution.

The layer 702 is conformal and formed using a process such as chemical vapor deposition or sputtering. It is sacrificial and may be removed using processes typical in semiconductor fabrication, for example, an $O_2$ and $CF_4$ ash. The capping layer 702 does not change the physical, electrical or mechanical functionality of the micromirror device 600. Temperatures for deposition of layer 702 are limited by temperature limits of the materials, such as photoresist, below used for spacer layers. Film thicknesses for capping layer 702 are approximately 100 to 500 Angstroms. Layer 702 may be comprised of organic materials such as carbon or inorganic materials such silicon oxynitride.

In one example embodiment, the layer 702 is comprised of chemical vapor deposited carbon at approximately 200 degrees Celsius, at a thickness of about 200 A.

Figure 7C:
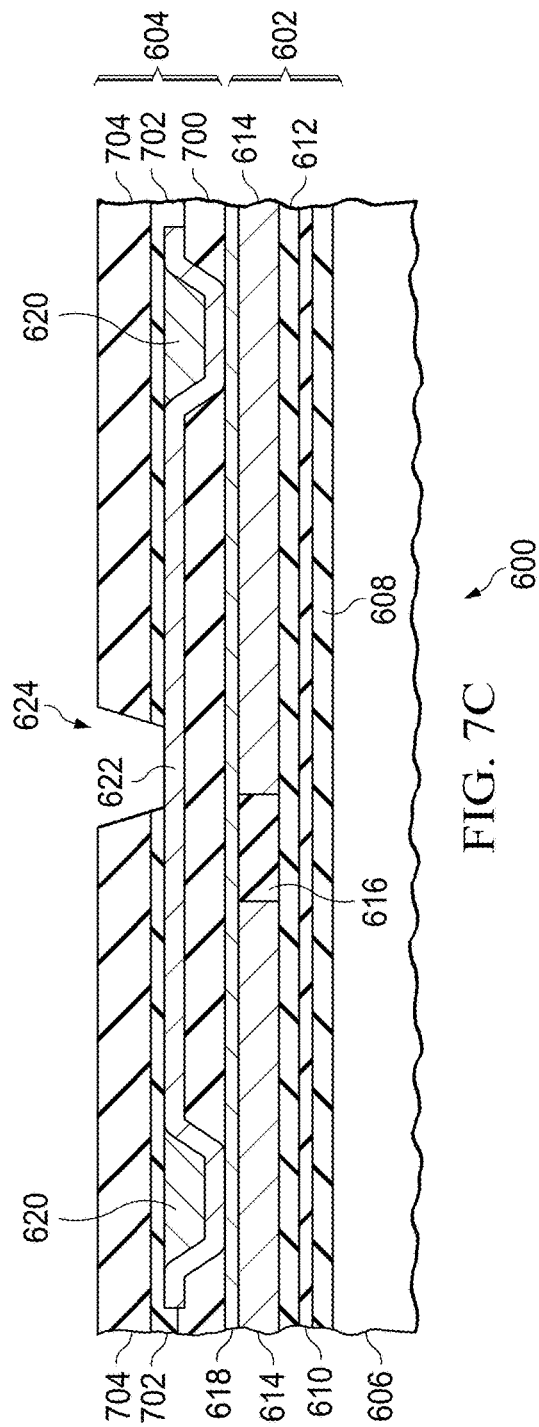

In FIG. 7C, the capping layer 702 is cleared from within the mirror via 624 using a plasma etch operation. No capping layer 702 remains within the via 624.

Figure 7D:
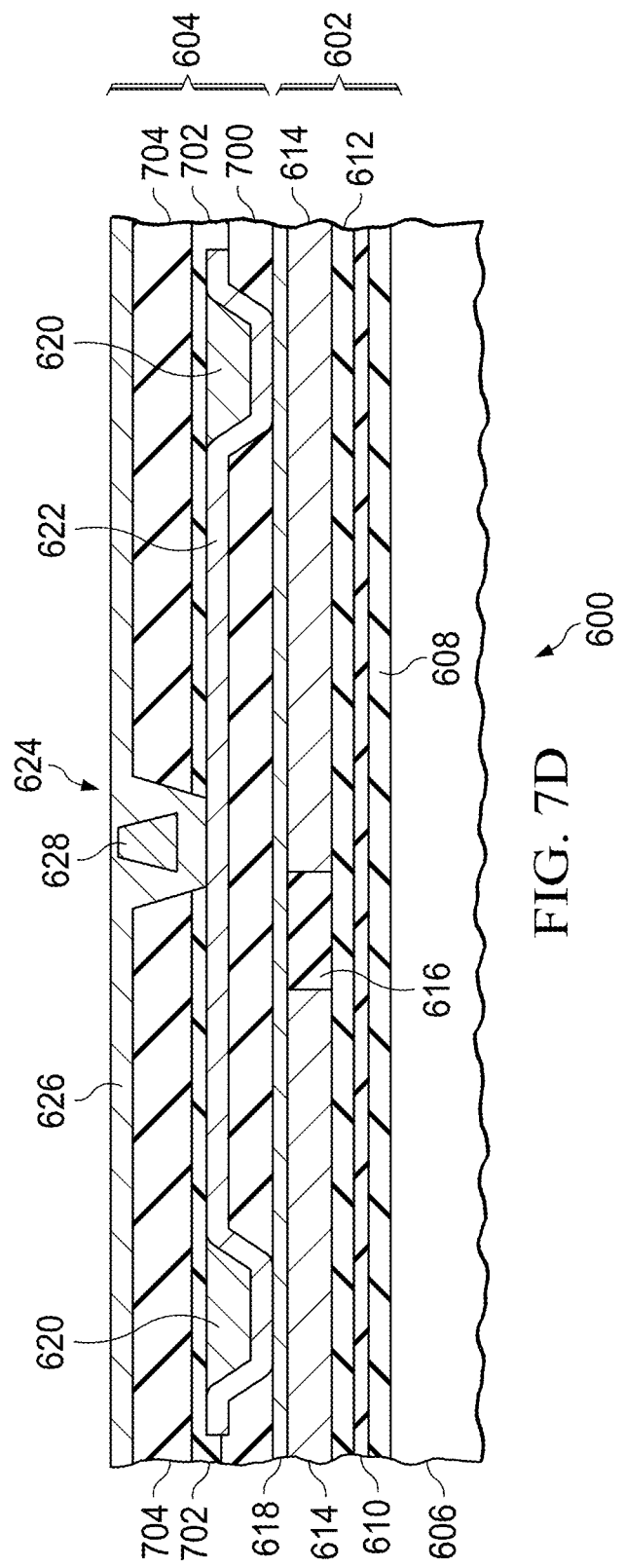

In FIG. 7D, a mirror metal is deposited above the layer 704 and within the mirror via 624 to form the mirror 626. The capping layer 702 remains between the sacrificial layer 704 and the hinge vias 620 and hinge 622. The central indentation 628 results from deposition of the metal above the mirror via 624.

After forming the mirror 626, the remaining sacrificial spacer layers 700 and 704 and the remaining capping layer 702 are removed in a plasma etch undercut operation using an $O_2$ and $CF_4$ ash. Removal of the spacer layers 700 and 704 releases the hinge 622 and mirror 626. The hinge vias 620 form free-standing supports for the hinge 622 and the mirror via 624 forms a free-standing support for the mirror 626.

One approach for addressing organo-metallo residue is to wash the mirror array with solutions to remove the residue. This approach results in defect formation on the surface of the mirror metal.

Yet another approach is to increase the etch time of mirror metal to remove the residue. This approach does not remove the residue and can damage the mirror surface.

Another approach is to form a polymer material above the hinge metal to prevent interaction between the developer solution and the hinge metal. This approach addresses the formation of organo-metallic residue but also can result in other defects.

The described methodology may offer many advantages.

The capping layer 702 protects the hinge 622 during mirror via 624 formation and forms a barrier against the developer solution.

The layer 702 is sacrificial and may be removed during the hinge 622 and mirror 626 release process.

The layer 702 forms a barrier against electrochemical attack of the hinge metal.

Experimental data has shown that the capping layer 702 is effective against organo-metallic residue and improves device reliability failures.

Those skilled in the art to which the invention relates will appreciate that modifications may be made to the described example embodiments, and also that many other embodiments are possible, within the scope of the claimed invention.

What is claimed is:

1. A method of fabricating a microelectromechanical system (MEMS) device, comprising:
   depositing a first photoresist spacer layer above a substrate with circuits formed therein;
   patterning hinge via openings within the first photoresist spacer layer;
   depositing a hinge metal layer above the first photoresist spacer layer and within the hinge via openings to form a hinge and hinge vias;
   depositing a capping layer above the hinge metal layer and above the hinge vias;
   depositing a second photoresist spacer layer above the capping layer;
   using a developer solution to pattern a mirror via opening within the second photoresist spacer layer, wherein the capping layer at a bottom of the mirror via opening prevents the developer solution from touching the hinge metal layer;
   removing the capping layer exposed at the bottom of the mirror via opening to expose the hinge metal layer at the bottom of the mirror via opening;
   depositing a mirror metal within the mirror via opening and above the second photoresist spacer layer to form a mirror and mirror via, wherein the mirror metal contacts the hinge metal layer at a bottom of the mirror via;
   removing the first and second photoresist spacer layers and capping layer using an oxygen ash to release the hinge and the mirror.

2. The method of claim 1, wherein the capping layer is conformal.

3. The method of claim 1, wherein the capping layer is sacrificial.

4. The method of claim 1, wherein the thickness of the capping layer is 100 to 500 Angstroms.

5. The method of claim 1, wherein the capping layer comprises a dielectric.

6. The method of claim 1, wherein the capping layer comprises a chemical vapor deposited carbon material.

7. The method of claim 1, wherein the capping layer comprises a silicon oxynitride material.

8. The method of claim 1, wherein the capping layer is removed using an $O_2$ and $CF_4$ ash process.

9. A method of fabricating a digital micromirror device, comprising:
   depositing a first photoresist spacer layer above a substrate, the first photoresist spacer layer comprising a photoresist;
   patterning hinge via openings within the first photoresist spacer layer;
   depositing a hinge metal layer above the first photoresist spacer layer and within the hinge via openings to form a hinge and hinge vias;
   depositing a capping layer above the hinge metal layer, wherein the capping layer comprises a chemical vapor deposited carbon material;
   depositing a second photoresist spacer layer above the capping layer, the second photoresist spacer layer comprising photoresist;
   patterning a mirror via opening within the second photoresist spacer layer to expose the capping layer, wherein the patterning step uses a developer solution, and wherein the capping layer prevents the developer solution from contacting the hinge metal layer;
   removing the capping layer within the mirror via opening using a plasma etch process after the patterning step, to expose the hinge metal layer within the mirror via opening;
   depositing a mirror metal within the mirror via opening and above the second photoresist spacer layer to form a mirror and mirror via, wherein the mirror metal contacts the hinge metal layer at a bottom of the mirror via;
   removing the first and second photoresist spacer layers and capping layer using an oxygen ash to release the hinge and the mirror.

10. The method of claim 9, wherein the capping layer is conformal.

11. The method of claim 9, wherein the capping layer is sacrificial.

12. The method of claim 9, wherein the thickness of the capping layer is approximately 100 to 500 Angstroms.

13. The method of claim 9, wherein the capping layer is removed using an $O_2$ and $CF_4$ ash process.

* * * * *